United States Patent
Hentz

(10) Patent No.: US 9,293,686 B2
(45) Date of Patent: Mar. 22, 2016

(54) IN-PLANE ACTUATED RESONANT DEVICE AND METHOD OF MANUFACTURING THE DEVICE

(75) Inventor: Sebastien Hentz, Varces Allieres et Risset (FR)

(73) Assignee: Commissariat a l'énergie atomique et aux énergies alternatives, Paris (FR)

( * ) Notice: Subject to any disclaimer, the term of this patent is extended or adjusted under 35 U.S.C. 154(b) by 24 days.

(21) Appl. No.: 13/818,771

(22) PCT Filed: Sep. 9, 2011

(86) PCT No.: PCT/EP2011/065682
§ 371 (c)(1),
(2), (4) Date: Feb. 25, 2013

(87) PCT Pub. No.: WO2012/034949
PCT Pub. Date: Mar. 22, 2012

(65) Prior Publication Data
US 2013/0154440 A1    Jun. 20, 2013

(30) Foreign Application Priority Data
Sep. 13, 2010   (FR) ..................................... 10 57252

(51) Int. Cl.
*H01L 41/053*   (2006.01)
*H01L 41/107*   (2006.01)
(Continued)

(52) U.S. Cl.
CPC ............ *H01L 41/107* (2013.01); *H01L 41/053* (2013.01); *H01L 41/35* (2013.01);
(Continued)

(58) Field of Classification Search
CPC ......... H02N 2/02; H02N 2/026; H02N 2/028; H02N 2/04; H02N 2/043; H01L 41/053; H03H 9/02259; H03H 9/2457
USPC ................ 310/306, 323.01–323.21, 328, 338
See application file for complete search history.

(56) References Cited

U.S. PATENT DOCUMENTS 5,942,837 A * 8/1999 Reuter .......................... 310/328
6,389,898 B1   5/2002 Seidel et al.
(Continued)

FOREIGN PATENT DOCUMENTS

| DE | 198 12 773 A1 | 9/1999 |
| EP | 1 316 977 A2 | 6/2003 |
| EP | 2 008 965 A2 | 12/2008 |

OTHER PUBLICATIONS

U.S. Appl. No. 13/820,756, filed Mar. 5, 2013, Hentz.
(Continued)

*Primary Examiner* — Derek Rosenau
(74) *Attorney, Agent, or Firm* — Oblon, McClelland, Maier & Neustadt, L.L.P.

(57) ABSTRACT

An in-plane actuated resonant device, and method of manufacturing the device. The device includes a support; a suspended beam, moving parallel to the plane of the surface of the support and anchored to the support through at least one of its ends; and a mechanism actuating the beam to enable its displacement parallel to the support. The actuation mechanism includes at least one suspended element, anchored to the support and to one lateral face of the beam. The element moves when a control voltage is applied to the element and thus causes displacement of the beam. The device may be manufactured using surface technology and is applicable particularly for resonant mass sensors.

14 Claims, 8 Drawing Sheets

(51) Int. Cl.
*H03H 9/02* (2006.01)
*H03H 9/24* (2006.01)
*H01L 41/35* (2013.01)

(52) U.S. Cl.
CPC ......... *H03H9/02259* (2013.01); *H03H 9/2457* (2013.01); *H03H 2009/02496* (2013.01); *Y10T 29/42* (2015.01)

(56) References Cited

U.S. PATENT DOCUMENTS

| | | | |
|---|---|---|---|
| 7,446,456 B2* | 11/2008 | Maruyama et al. | 310/328 |
| 2002/0194942 A1 | 12/2002 | Jensen et al. | |
| 2003/0101721 A1 | 6/2003 | Janssen et al. | |
| 2004/0074234 A1* | 4/2004 | Howell et al. | 310/306 |
| 2008/0314148 A1 | 12/2008 | Robert et al. | |

OTHER PUBLICATIONS

U.S. Appl. No. 13/821,701, filed Mar. 8, 2013, Hentz et al.
International Search Report Issued Oct. 24, 2011 in PCT/EP2011/065682.
Preliminary French Search Report Issued Aug. 29, 2011 in Patent Application No. 1057252 (with English translation of Categories of Cited Documents).
E. Mile et al., "In-plane nanoelectromechanical resonators based on silicon nanowire piezoresistive detection", Nanotechnology, vol. 21, Issue 16, 17 pages.
Mo Li et al., "Ultra-sensitive NEMS-based cantilevers for sensing, scanned probe and very high-frequency applications", Nature Nanotechnology, vol. 2, 2006, 7 pages.
R.B. Karabalin et al., "Piezoelectric nanoelectromechanical resonators based on aluminum nitride thin films", Applied Physics Letters, vol. 95, 2009, pp. 103111-1-103111-3.

* cited by examiner

IN-PLANE ACTUATED RESONANT DEVICE AND METHOD OF MANUFACTURING THE DEVICE

TECHNICAL FIELD

This invention relates to an in-plane actuated resonant device, and a method of manufacturing this device.

Applications of the invention are particularly in the field of MEMS (Micro-Electro-Mechanical Systems) and NEMS (Nano-Electro-Mechanical Systems) type resonant devices.

For example, it is applicable for resonant sensors, particularly mass sensors.

STATE OF PRIOR ART

At nanometric scales, the question of the choice of transduction remains undecided, not only concerning the choice of detection of the resonator movement, but also concerning its actuation.

The most frequently used actuation types in the field of MEMS or even NEMS are electrostatic, thermoelastic and piezoelectric actuations, which are described in the following documents respectively:

[1] E. Mile et al., Nanotechnology, Vol. 21 Issue 16, pp. 165504 (2010)
[2] M. Li et al., Nature Nanotechnology, 2, 114-120 (2006)
[3] R. B. Karabalin et al., Applied Physics Letters, 95, 03111 (2009).

The only easy way of obtaining an in-plane resonator movement is to use electrostatic actuation through the use of one or several etched and isolated electrodes. FIG. 1 shows an example of such use.

This figure is a diagrammatic top view of a known resonant device, disclosed in the following document, which should be referred to:

[4] US 2008/0314148, invention by P. Robert, corresponding to EP 2008965.

This known device is formed on a substrate and it comprises:
- a resonator 2 in the form of a beam connected to the substrate through at least one embedment 4 (in fact, a second embedment 5 is provided in the example shown, as can be seen),
- a fixed electrode 6 to actuate the resonator,
- an alternating voltage source 8, to bring the electrode to an alternating voltage relative to the resonator, this resonator then vibrating parallel to the plane of the surface of the substrate, which is symbolised by the double arrow 9 in FIG. 1,
- a suspended strain gauge 10 made of a piezoresistive material, and
- means 12 of measuring the stress applied to the gauge 10.

Note that the gauge 10 is connected to the resonator 2 at a point outside the embedment 4. This arrangement thus provides a lever arm that increases the stress applied to this gauge.

An in-plane movement may be required for several reasons, particularly the freedom that such a movement provides for choosing the detection type.

This may for example be a detection using one or several etched semiconducting piezoresistive gauges, which is the case for the device shown in FIG. 1.

Another reason relates to the design of the resonator with in-plane movement.

For example, the resonant frequency of the resonator is independent of the resonator thickness when it is vibrating in-plane. Thus, the manufacturing method (or other constraints) may determine the thicknesses of the different component materials of the resonator, while having little influence on its resonant frequency.

On the other hand, the use of an electrostatic actuation imposes the presence of an air gap. This air gap must be sufficiently small to minimise the actuation voltage but sufficiently large to enable a large movement amplitude and thus maximise the signal-to-noise ratio.

On the other hand, it is complicated to obtain a large in-plane amplitude vibration when a piezoelectric or thermoelastic actuation is used. Usually, such actuation can only achieve very small deformations of the order of a few tenths of a percent.

This is true for a micrometric resonator for which large amplitudes can only be reached by using a very complex structure. It is even more true for a smaller resonator and particularly for a nanometric sized resonator. One of the dimensions of such a resonator, measured parallel to the plane of the substrate on which the resonator is formed, is often at the limit of what known manufacturing techniques can achieve.

It is known that piezoelectric actuation requires at least three layers, namely one piezoelectric layer between two conducting layers that form the lower and upper electrodes respectively. Therefore, contacts are made vertically. It is then necessary to have access to the lower electrode to polarise the device. Refer to document [3] for information about this subject.

Conversely, a thermoelastic actuator only comprises a single material, through which an electric current has to be passed to vary the temperature of this material in an alternating manner. Therefore such an actuator requires two connections at the same technological level in the plane of the substrate.

Thus, these piezoelectric and thermoelastic actuations have similar mechanical effects on the resonator to be actuated, but each has its own advantages and disadvantages.

Therefore it is very difficult or even impossible to use these two types of actuation to obtain an in-plane movement in the case of a resonator with nanometric dimensions or dimensions at the limits of known manufacturing techniques.

PRESENTATION OF THE INVENTION

The purpose of this invention is to overcome this disadvantage.

It makes use of the fact that thermoelastic or piezoelectric type actuation means can only achieve very small deformations but can reach high stress levels.

According to the invention, means of actuating a beam forming the resonator are decoupled from the beam so that the size of the beam can be achieved with the manufacturing technique used, and so that the beam can be placed at the locations at which its displacements are small, in other words close to an anchor point of the beam.

Note that this invention is not limited to nanometric-sized resonant devices (NEMS): it is also applicable to large resonant devices, particularly micrometric sizes (MEMS).

Specifically, the purpose of this invention is an in-plane actuated resonant device, comprising:
- a support comprising an approximately plane surface,
- a beam suspended from the support, capable of moving parallel to the plane of the surface of the support and anchored to the support through at least one of its ends, and means of actuating the beam to enable displacement parallel to the plane of the surface of the support,
characterised in that the actuation means comprise at least one element suspended from the support and anchored firstly to the support and secondly to one of the lateral faces of the beam, the suspended element being capable of moving when a control voltage is applied to it, and thus causing displacement of the beam.

Document DE 198 12 773 corresponding to U.S. Pat. No. 6,389,898 by Seidel et al., discloses a micro-sensor with a resonant structure comprising a resonant element and means of actuating this element; but the element is anchored to a support through actuation means. On the contrary, in the device according to the invention, the beam forming the resonator has its own anchor means; it is thus anchored to the support independently of the actuation means.

According to a first preferred embodiment of the device according to the invention, the actuation means are of the piezoelectric type and the suspended element comprises a piezoelectric stack.

In this case, according to one particular embodiment of the device, the suspended element becomes narrow at one end anchored to the lateral face of the beam.

According to a second preferred embodiment of the device according to the invention, the actuation means are of the thermoelastic type and the suspended element comprises an electrically conducting layer.

According to one particular embodiment of the invention, the actuation means comprise at least two elements suspended from the support and that are anchored firstly to the support and secondly to one of the lateral faces of the beam, the suspended elements being capable of moving when a control voltage is applied to them, and thus causing displacement of the beam.

According to one particular embodiment of the device according to the invention, this device also comprises means of detecting displacement of the beam.

The detection means may be chosen from among piezoresistive detection means and capacitive detection means.

In the first preferred embodiment mentioned above, the detection means may comprise a strain detection gauge, composed of the suspended element.

This invention also relates to a method of manufacturing the device according to the invention, in which the beam and the suspended element are formed using surface technology.

BRIEF DESCRIPTION OF THE DRAWINGS

This invention will be better understood after reading the description of example embodiments given below purely for information and that is in no way limitative, with reference to the appended drawings in which.

DETAILED PRESENTATION OF PARTICULAR EMBODIMENTS

Figure 1:
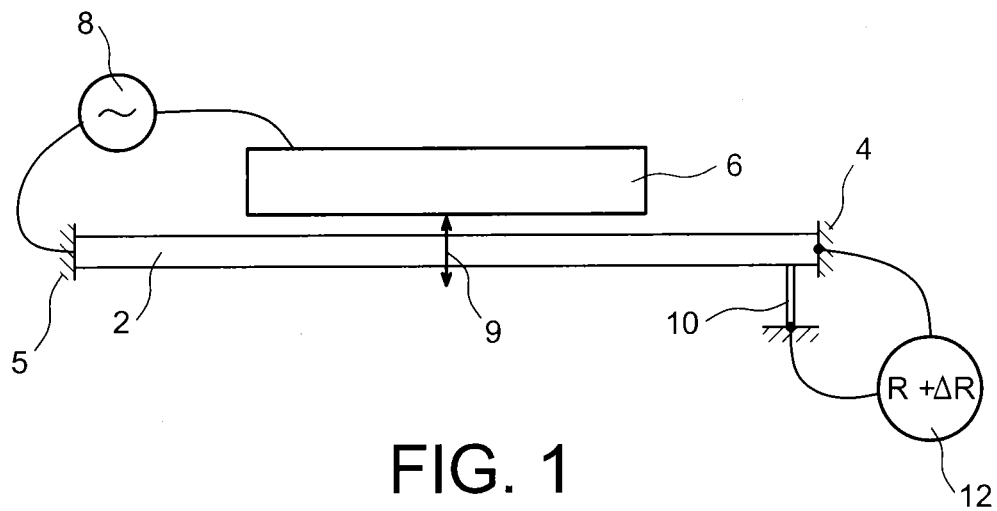
FIG. 1 is a diagrammatic top view of a known resonant device, and has already been described.
Figure 2:
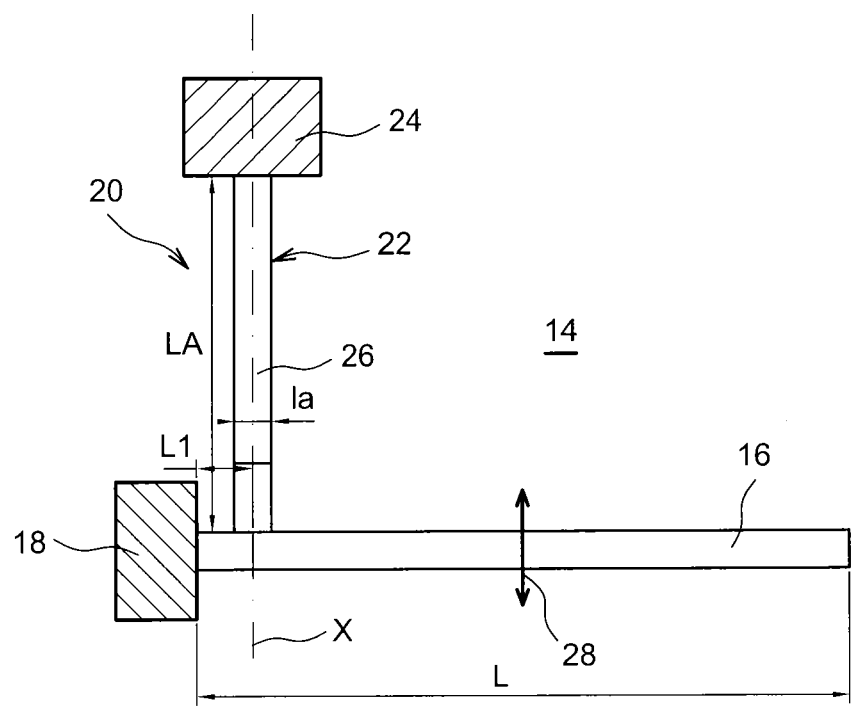
FIGS. 2 to 8 are diagrammatic top views of particular embodiments of the device according to the invention, FIGS. 9A to 9G diagrammatically show various steps in a method of manufacturing a device conforming with the invention, in which the actuation is of the piezoelectric type, and FIGS. 10A to 10E diagrammatically show various steps in another method of manufacturing a device conforming with the invention, in which the actuation is of the thermoelectric type.

FIG. 2 is a diagrammatic top view of a particular embodiment of the resonant device according to the invention.

The device shown in this figure comprises:
a support 14, or substrate, the surface of which is approximately plane,
a beam 16, forming a resonator that is suspended from the support and is capable of moving parallel to the plane of the surface of the support, and is provided with an anchor 18 to the support at one of its ends,
means 20 of actuating the beam to enable its displacement parallel to the plane of the surface of the support, and
means of detecting displacement of the beam.

These detection means are not shown in FIG. 2 but examples of such means will be given later with reference to other figures.

In the example shown in FIG. 2, the actuation means 20 comprise an element in the form of a beam 22. This beam-shaped element is suspended from the support 14 and is anchored to it at one end. The reference of the anchor is 24. The beam 22 is also anchored to one of the lateral faces of the beam 16, close to the anchor 18 as can be seen.

The suspended beam 22 is capable of displacing when a control voltage is applied to it, and thus causing displacement of the beam 16. Piezoelectric type actuation means are used to achieve this in the example in FIG. 2: the beam 22 is provided with a piezoelectric stack 26.

In a known manner, this piezoelectric stack comprises a piezoelectric layer between a lower conducting layer and an upper conducting layer, that is the only layer visible on the top view in FIG. 2.

The means of applying the control voltage between the two conducting layers are not shown. This voltage is alternating to make the beam 16 vibrate. Its vibrations are symbolised by the double arrow 28 in FIG. 2.

As can be seen, the stack 26 is formed over the entire width la of the structural layer that forms the beam 22 and the beam 16 forming the resonator. Note that la is made sufficiently large to enable formation of the piezoelectric stack.

The polarisation frequency of the piezoelectric stack (frequency of the control voltage) enables resonance of the beam 16 in the required mode. The required vibration amplitude is obtained by choosing the position of the anchor of the beam 22 on the beam 16, the value of the control voltage and the length LA of the beam 22.

Application of the voltage to the stack 26 causes a deformation 8 along the X axis of the beam 22. The displacement d obtained at the end of the beam 22 is therefore equal to $LA \times \epsilon$.

Typically, the distance L1 between the anchor 18 and the neutral axis (mid-width) of the beam 22 is chosen to be equal to one tenth of the length L of the beam 16; and the value of the voltage used typically varies from 10 mV to a few volts.

The width la of the beam 22 may be the minimum possible dimension that the method of forming the piezoelectric stack 26 can achieve. However, it must be small enough in comparison with the total length L of the resonator to not hinder movement of the resonator (and obviously so that it is not constrained by the substrate 14).

Figure 3:
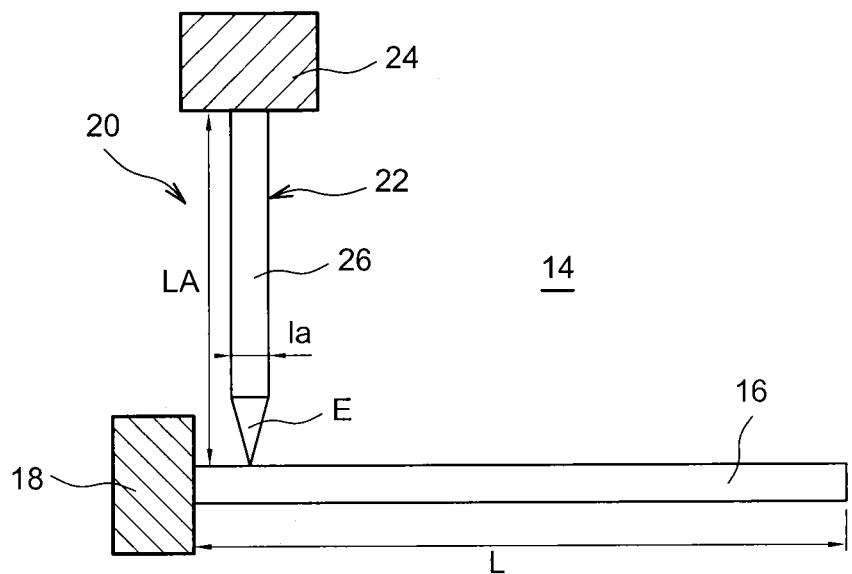

If the width la is not small enough in comparison with L, the beam 22 may be narrower at its end E anchored to the beam 16, as can be seen on the top view in FIG. 3.

The actuation used in this invention in no way changes the method of detecting resonator displacement. For example, this detection may be piezoresistive or capacitive.

Figure 4:
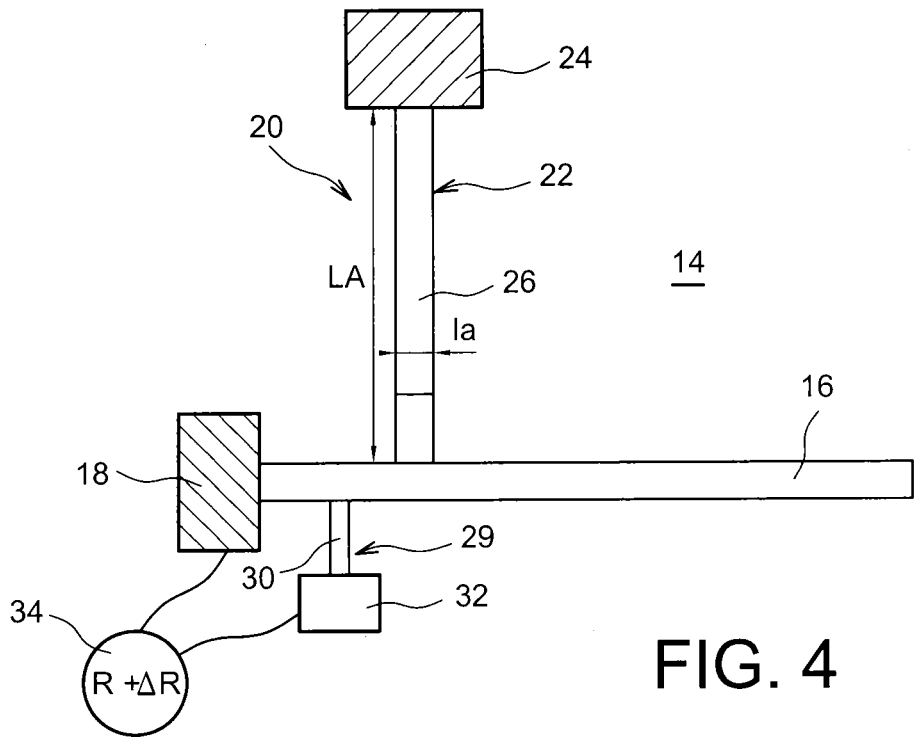

FIG. 4 diagrammatically shows a piezoresistive detection. The device in FIG. 3 can be seen, together with detection means 29 comprising a piezoresistive gauge 30, one end of which is fixed to the beam 16 and the other end is anchored to the support 14. The reference of the corresponding anchor is 32.

Conventional reading means 34, for example comprising a Wheatstone bridge (see document [4]) are connected between anchors 32 and 18, then assumed to be electrically conducting.

In FIG. 4, the beam 22 and the gauge 30 are placed on each side of the beam 16 and the gauge 30 is closer to the anchor 18 than the beam 22. However, the beam 22 and the gauge could be on the same side of the beam 16; and the beam 22 might be closer to the anchor 18 than the gauge 30.

In another particular embodiment, the piezoelectric stack 26 included in the beam 22 is used as a strain detection gauge, to detect displacement of the beam 16; it is then a piezoelectric displacement measurement.

Figure 5:
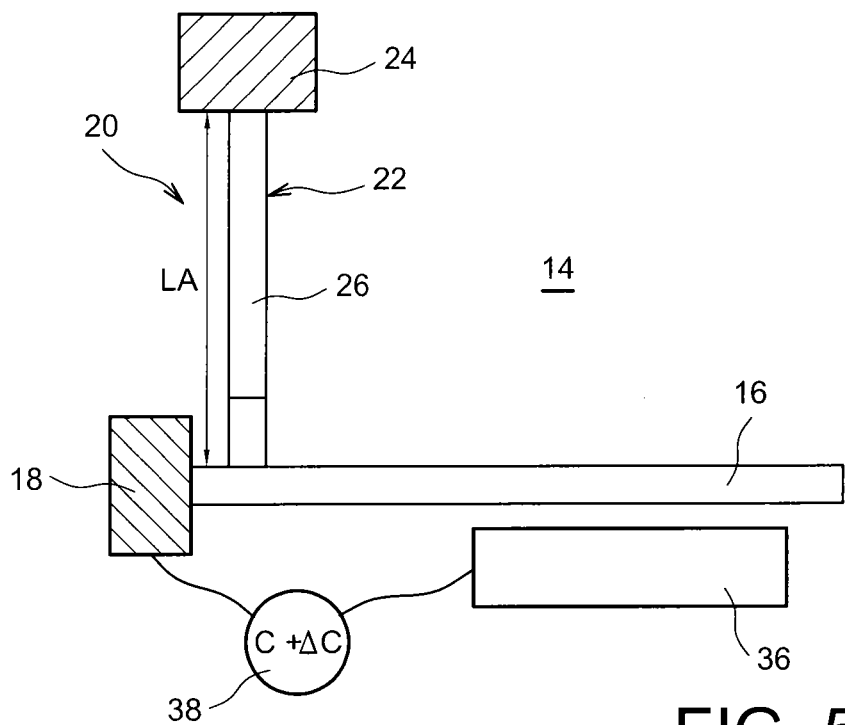

FIG. 5 diagrammatically illustrates a capacitive detection. The figure shows the device in FIG. 3, together with detection means comprising an electrode 36 fixed to the substrate 14 close to the beam 16.

Conventional read means 38 are connected between the electrode 36 and the anchor 18 then assumed to be electrically conducting, to measure a change in capacitance when the beam 16 vibrates.

Figure 6:
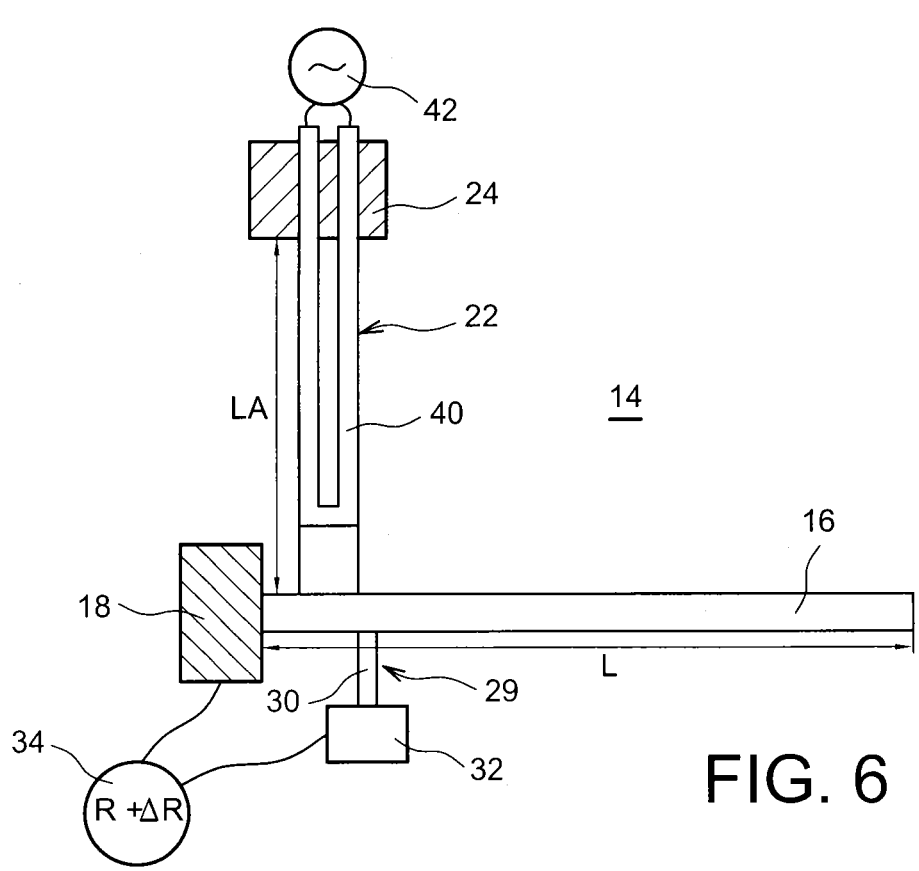

FIG. 6 shows a diagrammatic top view of another example of the invention, in which the actuation means are of the thermoelastic type. Furthermore, in the example shown, a piezoresistive detection of the displacement of beam 16 is used as is the case in FIG. 4.

The example in FIG. 6 is thus different from the example in FIG. 4 in that the piezoelectric stack has been replaced by a conducting layer 40 formed on the structural layer of beam 22. As before, the beam 22 is assumed to be sufficiently wide so that the layer 40 can be formed.

A "loop" type thermoelastic actuation is used in the example shown in FIG. 6; as can be seen, the layer 40 forms a loop that begins at the anchor 24, extends along the beam 22 and then returns to the anchor 24 assumed to be electrically insulating or insulated from the loop-shaped layer 40.

An appropriate alternating voltage source 42 is connected between the two ends of the layer 40 to heat the layer 40, by circulating a current in it in order to actuate the beam 16.

Figure 7:
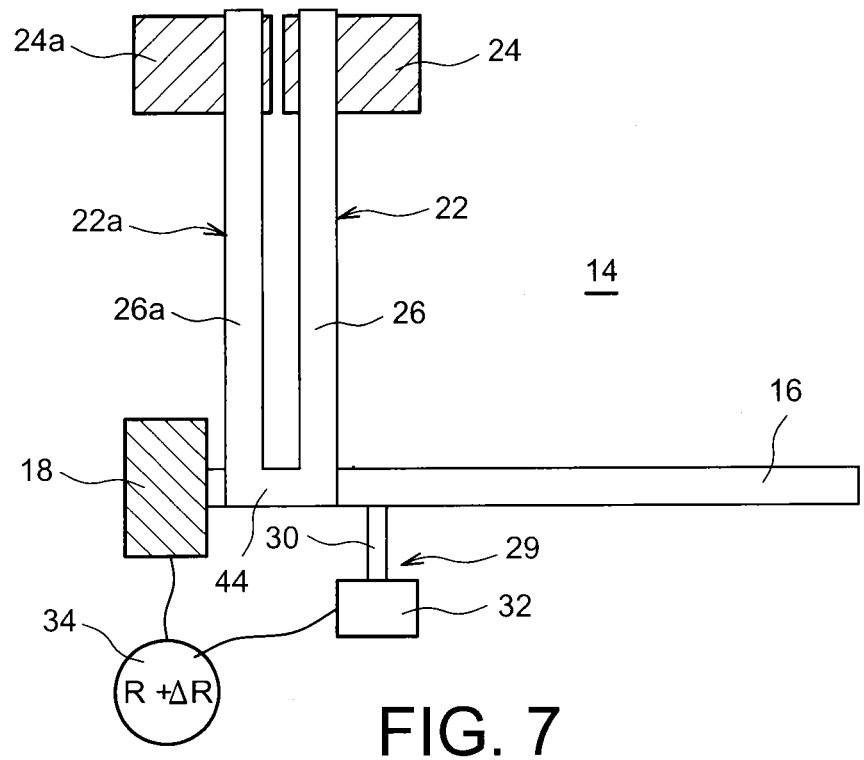

FIG. 7 is a diagrammatic top view of another example of the invention, in which the suspended element comprises two branches, while there is only one in the case in FIG. 4.

More precisely, FIG. 7 illustrates the beam 22, the anchor 24 and the stack 26 in FIG. 4, together with a parallel beam 22a. As can be seen, the parallel beam is anchored, on one side, to the beam 16, and on the other side, to the substrate 14 through an anchor 24a. The reference of the piezoresistive stack formed on the structural layer of the beam 22a is 26a.

Furthermore, as can be seen, a portion 44 of the piezoresistive stack is formed on the beam 16 (the corresponding structural layer was etched for this purpose). This portion 44 connects the stacks 26 and 26a.

Figure 8:
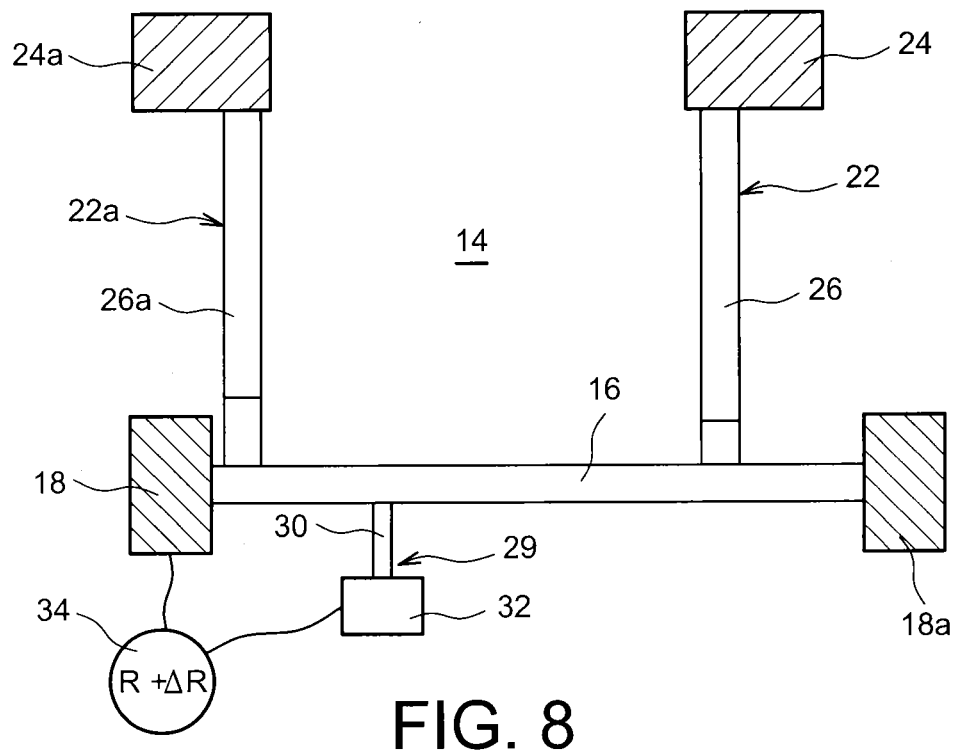

FIG. 8 shows a diagrammatic top view of another example of the invention in which two suspended elements are used instead of a single element, to actuate the beam 16 forming a resonator.

In the example in FIG. 8, the actuation is of the piezoelectric type but it could be thermoelastic.

Furthermore, in this example, the beam 16 is provided with two anchors 18 and 18a to the substrate 14, at each of its two ends.

This example in FIG. 8 is different from the example in FIG. 7 in that the beams 22 and 22a are at a greater distance from each other than in the case in FIG. 7, and in that their corresponding stacks 26 and 26a are not connected to each other through a portion of piezoresistive stack.

It then becomes possible to apply two different control voltages, possibly with different frequencies, to the two beams 22 and 22a.

A device according to the invention may be fabricated by surface technology.

One example manufacturing method is diagrammatically and partially shown in FIGS. 9A to 9G in the case of a piezoelectric type actuation.

Figure 9A:
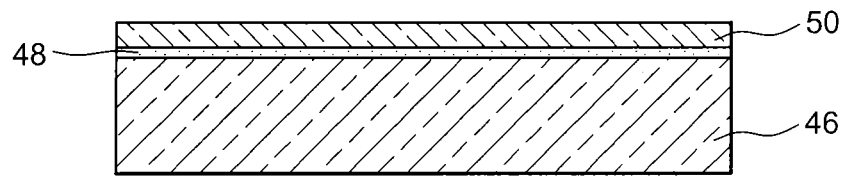

An SOI substrate is used comprising a silicon base substrate 46, a $SiO_2$ sacrificial layer 48 for example 0.4 µm thick, and a silicon layer 50 for example 0.16 µm thick (FIG. 9A).

Figure 9B:
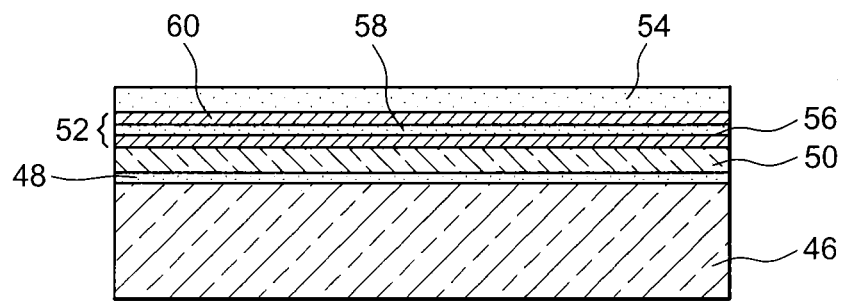

The first step is to deposit a Mo/AlN/Mo piezoelectric stack 52 on the layer 50 and then a $SiO_2$ layer 54 forming a hard mask, on the stack 52. The references of the lower Mo layer, the intermediate AlN layer and the upper Mo layer are 56, 58 and 60 respectively (FIG. 9B).

Figure 9C:
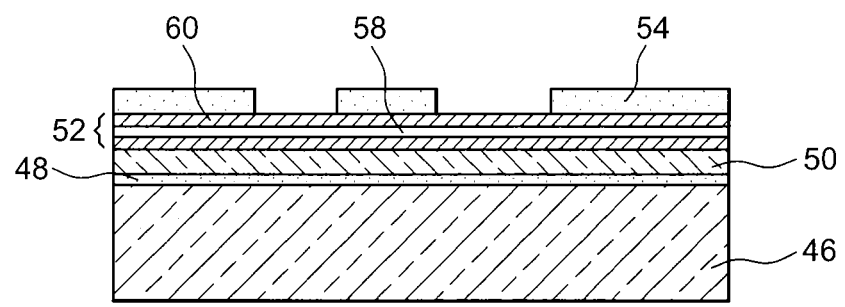

The next step is to perform a photolithography and RIE etching (Reactive Ion Etching) of the mask 54, stopping on the layer 60 (FIG. 9C).

Figure 9D:
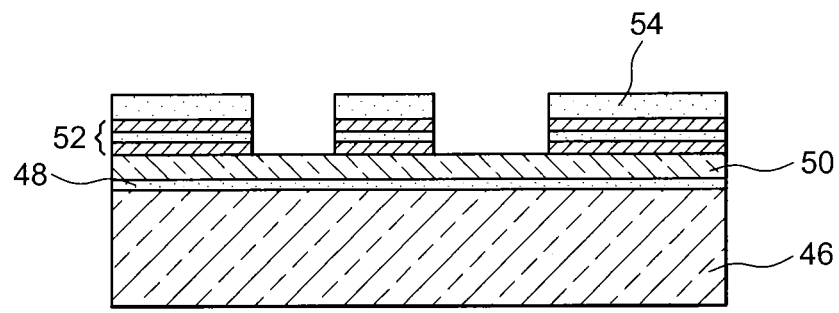

The next step is dry etching of the stack 52 stopping on the silicon layer 50 (FIG. 9D).

Figure 9E:
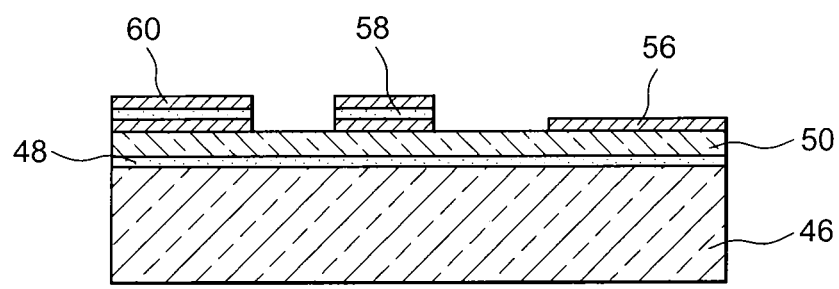

The next step is to etch the upper Mo layer and the AlN layer to expose the lower Mo layer and thus to obtain electrical contacts (FIG. 9E).

Figure 9F:
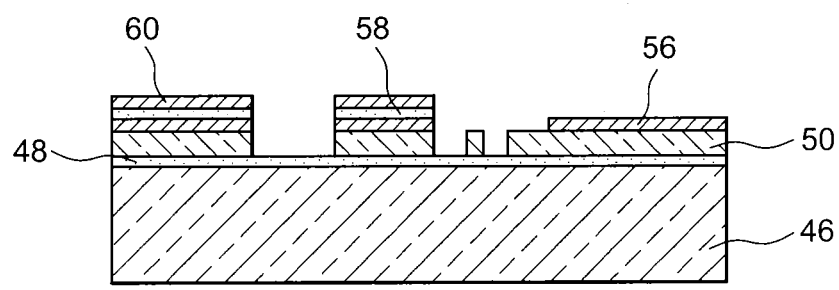
Figure 9G:
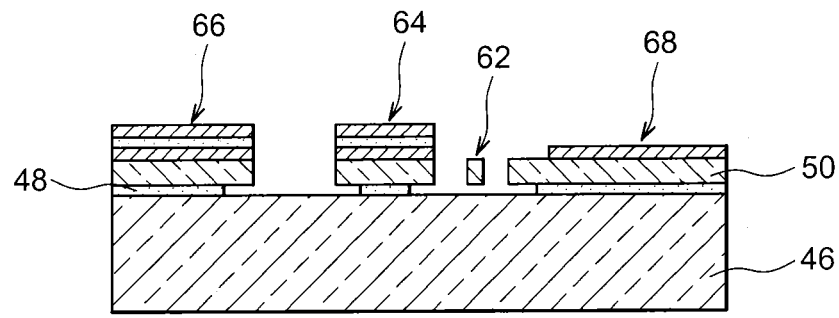

Photolithography and RIE etching of the silicon layer 50 are then done, stopping on layer 48 (FIG. 9F).

The components of the device are then released (FIG. 9G) by exposure to hydrofluoric acid.

The result is thus a resonator 62 and an associated piezoelectric stack 64. The references 66 and 68 correspond to the upper and lower contacts respectively (sectional view) that are required to apply the control voltage to the stack 64.

FIGS. 10A to 10E diagrammatically and partially show another manufacturing method, in the case of a thermoelastic type actuation.

Figure 10A:
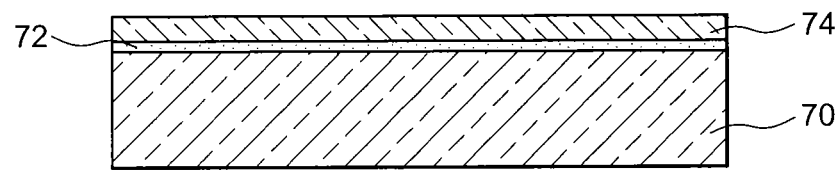

An SOI substrate is used again, comprising a silicon base substrate 70, an $SiO_2$ sacrificial layer 72, for example 0.4 µm thick, and a silicon layer 74, for example 0.16 µm thick (FIG. 10A).

Figure 10B:
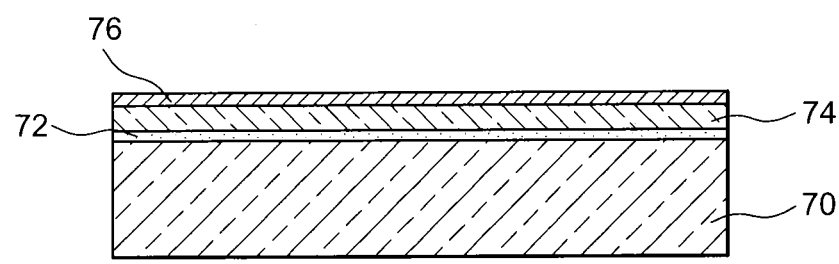

The first step is to deposit a metallic layer 76, for example made of AlSi or Mo, on the layer 74 (FIG. 10B).

Figure 10C:
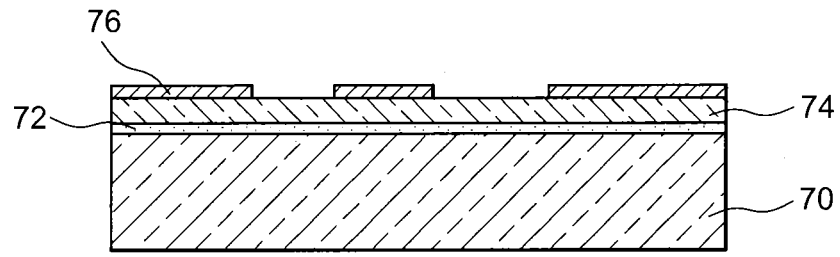

The next step is photolithography and etching of the metallic layer 76, stopping on the silicon layer 74 (FIG. 10C).

Figure 10D:
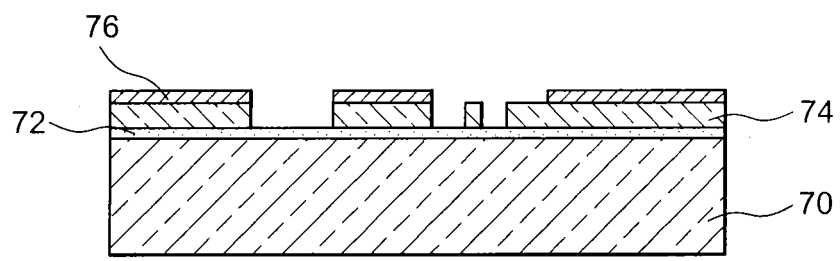

The next step is photolithography and RIE etching of the silicon layer 74, stopping on the layer 72 (FIG. 10D).

Figure 10E:
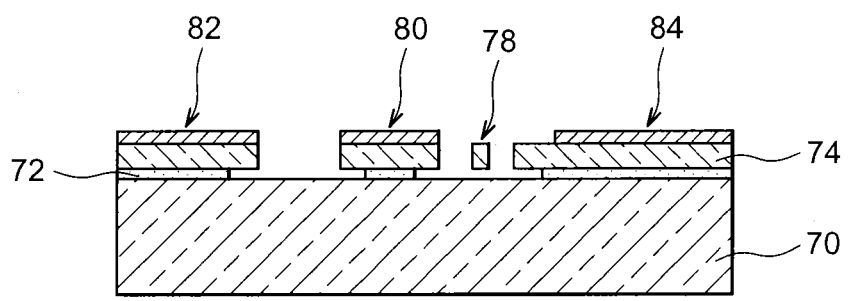

As before, the next step is to release the components of the device by exposure to hydrofluoric acid (FIG. 10E)

The result is thus a resonator 78 and an associated conducting layer 80. References 82 and 84 respectively correspond to conducting portions (sectional views) used to apply the control voltage to the layer 80.

In the examples given below, it is assumed that piezoelectric or thermoelastic type actuation means are used. But the invention could also be implemented with other types of actuation means.

The suspended element(s) (beams 22 and 22a with reference to the examples given) are then adapted to the chosen actuation type.

The invention claimed is:
1. An in-plane actuated resonant device, comprising:
a support comprising an approximately plane surface;
a beam forming a resonator having a first beam end anchored to said approximately plane surface via a first anchor such that a remaining portion of the beam is suspended from the support and configured to move parallel to the approximately plane surface of the support; and an actuating device configured to activate the beam to enable displacement parallel to the approximately plane surface of the support, wherein the actuation device comprises at least one suspended element having a first element end anchored to said approximately plane surface via a second anchor such that a remaining portion of the element is suspended from the support and anchored to one of lateral faces of the beam, such that the suspended element is configured to move when a control voltage is applied to the suspended element to cause displacement of the remaining portion of the beam.

2. A device according to claim 1, wherein the actuation device is of piezoelectric type and the suspended element comprises a piezoelectric stack.

3. A device according to claim 2, wherein the suspended element narrows at another element end which is anchored to the lateral face of the beam.

4. A device according to claim 1, wherein the actuation device is of thermoelastic type, and the suspended element comprises an electrically conducting layer.

5. A device according to claim 1, wherein the actuation device comprises at least two of said elements each configured to move when a control voltage is applied to the suspended elements to cause displacement of the remaining portion of the beam.

6. A device according to claim 1, further comprising a detecting device configured to detect displacement of the beam.

7. A device according to claim 6, wherein the detecting device comprises a piezoresistive detection device or a capacitive detection device.

8. A device according to claim 6, wherein the actuation device is of piezoelectric type and the suspended element comprises a piezoelectric stack, and wherein the detection device comprises a strain detection gauge including the suspended element.

9. A method of manufacturing the device according to claim 1, comprising forming the beam and the suspended element using surface etch technology.

10. A device according to claim 1, wherein said first anchor and said second anchor are each formed from a same layer of material.

11. A device according to claim 10, wherein said same layer of material is a silicon containing layer.

12. A device according to claim 1, wherein said first anchor and said second anchor are each formed from portions of a same sacrificial layer of material.

13. A device according to claim 12, wherein said same sacrificial layer of material is an $S_iO_2$ layer.

14. A device according to claim 1, wherein at least one of said first anchor and said second anchor is conductive.

* * * * *